(12) United States Patent
Ausserlechner

(10) Patent No.: US 7,301,353 B2
(45) Date of Patent: Nov. 27, 2007

(54) SENSOR ELEMENT FOR PROVIDING A SENSOR SIGNAL, AND METHOD FOR OPERATING A SENSOR ELEMENT

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 386 days.

(21) Appl. No.: 11/121,846

(22) Filed: May 4, 2005

(65) Prior Publication Data

US 2005/0258840 A1 Nov. 24, 2005

(30) Foreign Application Priority Data

May 4, 2004 (DE) .................... 10 2004 021 863

(51) Int. Cl.
*G01R 27/08* (2006.01)
*G01R 33/07* (2006.01)
*G01R 33/09* (2006.01)
*G01B 7/00* (2006.01)

(52) U.S. Cl. ............... 324/706; 324/207.2; 324/207.21; 324/251

(58) Field of Classification Search ........ 324/650–651, 324/705–706, 709, 725, 207.2, 251, 207.21; 330/6, 9, 62
See application file for complete search history.

(56) References Cited

U.S. PATENT DOCUMENTS

| | | | |
|---|---|---|---|
| 6,262,626 B1 | 7/2001 | Bakker et al. ............... | 330/9 |
| 2002/0047716 A1* | 4/2002 | Maher et al. ............... | 324/706 |
| 2003/0102909 A1* | 6/2003 | Motz .............................. | 330/9 |

FOREIGN PATENT DOCUMENTS

EP 0 548 391 A1 12/1991

OTHER PUBLICATIONS

Anton Bakker, et al.; A CMOS Nested-Chopper Instrumentation Amplifier with 100-n V Offset; IFEE Journal of Solid-State Circuits, vol. 35, No. 12, Dec. 2000.
C. Muller-Schwanneke, et al.; Offset Reduction in Silicon Hall Sensors; Sensors and Actuators 8 pp. 18-22, 2000.
Ch. Schott, et al.; Linearizing Integrated Hall Devices; Transducers'97 International Conference on Solid-State Sensors and Actuators, Chicago, IL, Jun. 1997.
P.J.A. Munter; Electronic Circuitry for a Smart Spinning-current Hall Plate with Low Offset; Sensors and Actuators A, 25-27; pp. 747-751, 1991.

* cited by examiner

*Primary Examiner*—Bot LeDynh
(74) *Attorney, Agent, or Firm*—Eschweiler & Associates, LLC

(57) ABSTRACT

A method for operating a sensor element having two contact terminal pairs, comprises steps of providing a first measurement value by applying a first controlled variable having a first polarity between the first terminal pair, and coupling the second terminal pair with output terminals; providing a second measurement value by applying a second controlled variable, having an opposed polarity, between the first terminal pair, and coupling the second terminal pair to the output terminals; providing a third measurement value by applying the first variable between the second terminal pair, and coupling the first terminal pair with the output terminals, providing a fourth measurement value by applying the second variable between the second terminal pair, and coupling the first terminal pair with the output terminals; and determining a sensor signal on the basis of a difference between the first and second values and a difference between the third and fourth values.

23 Claims, 3 Drawing Sheets

SENSOR ELEMENT FOR PROVIDING A SENSOR SIGNAL, AND METHOD FOR OPERATING A SENSOR ELEMENT

CROSS-REFERENCE TO RELATED APPLICATION

This application claims priority from German Patent Application No. 102004021863.3, which was filed on May 4, 2004, and is incorporated herein by reference in its entirety.

FIELD OF THE INVENTION

The present invention relates to the field of electronic semi-conductor sensors, and in particular, the present invention relates to a Hall sensor element exhibiting an improved offset characteristic.

DESCRIPTION OF PRIOR ART

In most cases, DC voltage amplifiers suffer from the offset problem, i.e. the fact that even with short-circuited input terminals, the output provides a signal different from zero, even though the ideal transfer function should be $U_a = G \cdot U_e$, wherein $U_a$ is the output voltage of the DC voltage amplifier, G is the amplification factor of the DC voltage amplifier, and $U_e$ is the input voltage of the DC voltage amplifier. The reason for this are small asymmetries of the amplifiers, which are mostly constructed as differential amplifiers. These asymmetries develop, e.g., by the action of mechanical pressure (i.e. stress) or by integrated switches having different conductivities which lead to different rates of decay of transient operations in differential circuits.

In addition to the offset, what is also disruptive, in particular, is an offset drift. Since the offset is caused by as little as by effects which are not sufficiently controllable, it may easily be understood that these effects may have highly different dependencies on temperature and thus exhibit an almost arbitrary behavior as a function of temperature.

Conventional DC voltage amplifiers with structures as symmetrical as possible still achieve offset values of 100 μV to 1 mV.

Hall probes also suffer from a relatively large offset, i.e. with a fading magnetic field, they still provide an output voltage. The reasons, in particular, of the offset drift which cannot be matched since it is unpredictable, lie predominantly in mechanical stress which disrupts the inherent symmetry of the probe by anisotropic conductivity which has been induced. Integrated Hall probes in conventional plastic housings in microelectronics have offset voltages equivalent to a flux density of, e.g., 5 to 15 mT.

In order to "free" DC voltage amplifiers from offset, there are different discrete-time methods mentioned, for example, in A. Bakker et al.: "A CMOS Nested-Chopper Instrumentation Amplifier with 100-nV Offset", IEEE Journal of Solid-State Circuits, Vol. 35, No. 12, December 2000, pp. 1877 to 1883.

What is advantageous, in particular, is the chopper technique, wherein the polarity of the input signal is reversed, in a fixed timing pattern, with a periodic switch. This results in the square-wave signal. Said input signal is amplified by the amplifier, and its polarity is subsequently-reversed again in-phase, so that the square-wave signal again becomes a DC voltage signal. The offset of the amplifier, which is added to the signal after the input chopper, appears, after the output signal, as a square-wave signal superimposed on the amplifying DC voltage signal. This DC voltage signal, which has been superimposed, may subsequently be separated from the signal by, e.g., a low-pass filter.

In practice, asymmetric charge injection has an adverse effect on such a chopper amplifier. This results from the use of transistors as switches of the input chopper. In terms of manufacturing technology, said transistors are often not configured to be completely identical, so that they inject different amounts of charge into the signal path. This leads to an error term superimposed on the signal. In particular for high chopper frequencies, the errors become large, since with each clock pulse edge, charge is injected into the signal path. This could be eliminated if it were possible to reduce the chopper frequency; this conflicts with the fact that at low frequencies, modulation noise becomes dominant and may thus ruin the improvements achieved by a reduction of the chopper frequency. Therefore, if possible, the chopper frequency should be higher than the break corner frequency of the 1/f noise, the latter being defined as that frequency at which the 1/f noise equals the white noise of the amplifier. This frequency is assumed to lie in the range from 1 kHz to 30 kHz for common integrated circuits (depending on the size of the structures as well as on the modulation-noise parameter which is dependent on the technology and is correlated with the number of defects in the semiconductor). Thus, the offset of common chopper amplifiers is assumed to lie in the order of magnitude from 1 to 10 μV—that is, two decades better than with continuous systems.

The above-mentioned literature shows several possibilities of increasing the performance of chopper amplifiers even more by filtering the energy of the charge injection within the chopper amplifier by means of a band-pass filter centered on the chopper frequency. However, this causes the problem that for a good selection, the band pass should have a high quality; in this case, however, the signal being compromised, in the case of variations of the band-pass parameters, and thus not being transmitted with a precisely defined amplification factor. As another possibility, the nested chopper described in the literature cited above, wherein the high-frequency chopper core is again embedded in a low-frequency chopper, may also be implemented. The high-frequency chopper reduces the 1/f noise by the large offset terms, the low-frequency chopper then reduces the glitch energy of the asymmetrical switches by time-averaging. This principle is also protected by U.S. Pat. No. 6,262,626 B1. By means of such a principle, offsets of about 100 nV may be achieved.

In order to "free" Hall probes from offset, there is also the principle of the spinning-current Hall probe. Here, the reciprocity of macroscopic probes (reverse magnetic field reciprocity) is used, as is described in more detail in C. Müller-Schwanneke et al.: "Offset Reduction in Silicon Hall Sensors", in: Sensors and Actuators 81(2000), pp. 18-22.

If a probe is configured to have a symmetry of 90°, and if the current is sent through the probe in both diagonals in an fashion, in one case the sum of the offset and of the magnetic field of proportional voltage may be tapped at the other two diagonals, and in the other case their difference may be tapped. Thus, the magnetic-field proportional signal may be freed from offset by correct-sign summing and/or integrating or low-pass filtering. However, even with such spinning-current Hall probes, practice sets a limitation, since it is only for electrically linear systems that this principle works perfectly well. However, due to the junction-field effect, the Hall probe mostly has a non-linear I(U) characteristic, as has been shown, for example, in Ch. Schott, R. S. Popovic, "Linearizing Integrated Hall Devices", in Transducers 97, 1997 International Conference on Solid-State Sensors and Actuators, Chicago, Jun. 16-19, 1997, Conference Proceedings, pp. 393-396.

Thus, in the averaging of the signals of two orthogonal current directions, there will be a small remaining offset of the probe.

In addition, in document

"Electronic Circuitry for a Smart Spinning-current Hall Plate with Low Offset" in: Sensors and Actuators A, 25-27 (1991), pp. 747-751

P. J. A. Munter presents a spinning-current Hall probe which, however, introduces a large amount of glitch energy into the Hall probe due to the frequent switching between gate terminal contacts and measuring contacts, which results in a comparatively large offset of the Hall probe.

With high magnetic sensitivities, the offset performance of simple chopper amplifiers and of simple spinning-current systems is not sufficient, as is shown by the following example. With a Hall ASIC, the signal of the Hall probe is amplified by a factor of 5000 to achieve a magnetic sensitivity of 180 mV/mT. At the output of the ASICs, the output voltage drifts by 40 mV with a fading magnetic field at a temperature change from −40° C. to +150° C. This corresponds to a temperature-induced offset change of 8 µV in the amplifier if one assumes that the Hall probes themselves exhibit no offset. If the offset drift of the output is traced back to the offset drift of the probe alone, and if one thus assumes a perfect amplifier, this probe would have an offset drift corresponding to 222 µT despite the spinning-current principle. The actual offset drift is somewhere in between, i.e. the amplifier has an offset drift of 1 to 5 µV, and the probe drifts at about 50 to 100 µT despite the spinning-current principle.

By means of the improved chopper principles (band-pass or nested chopper), one could reduce the offset drift of the amplifier by about one order of magnitude (i.e. by the factor 10), but one would not be able to lower the offset drift generated by the non-linearity of the probe, as has been described in the first-mentioned literature (A. Bakker et al.).

To lower the non-linearity of the probe, one could operate it at a low supply voltage, which, however, requires a higher amplification factor in the subsequent amplifier and thus, in turn, emphasizes the offset drift thereof even more, which means one is going round in circles.

SUMMARY OF THE INVENTION

Therefore, it is the object of the present invention to provide a sensor element and a method for operating a sensor element, which offer lower susceptibility to offset interference than the prior art.

In accordance with a first aspect, the invention provides a sensor element for providing a sensor signal, having:

a measuring element having first, second, third and fourth contact terminals;

a first output terminal and a second output terminal;

switching equipment for connecting the first or fourth contact terminals to the first output terminal, and for connecting the second or third contact terminals to the second output terminal;

a unit for applying a controlled variable between the first and second contact terminals or between the third and fourth contact terminals;

a control unit so as to, in a first measuring cycle, in a first measuring phase, apply a first controlled variable having a first polarity between the first and second contact terminals, connect the third contact terminal to the second output terminal, and connect the fourth contact terminal to the first output terminal so as to provide a first measurement value, subsequently in a second measuring phase, apply a second controlled variable, having a polarity opposed to the first polarity, between the first and second contact terminals, connect the third contact terminal to the second output terminal, and connect the fourth contact terminal to the first output terminal so as to provide a second measurement value; subsequently in a third measuring phase, apply the first controlled variable having the first polarity between the third and fourth contact terminals, connect the first contact terminal to the first output terminal, and connect the second contact terminal to the second output terminal so as to provide a third measurement value; subsequently in a fourth measuring phase, apply the second controlled variable, having the polarity opposed to the first polarity, between the third and fourth contact terminals, connect the first contact terminal to the first output terminal, and connect the second contact terminal to the second output terminal so as to provide a fourth measurement value; subsequently a determinator for determining the sensor signal, configured to provide the sensor signal on the basis of a difference between the first measurement value and the second measurement value, and a difference between the third measurement value and the fourth measurement value.

In accordance with a second aspect, the invention provides a method for operating a sensor element, the sensor element including a measuring element having first, second, third and fourth contact terminals, first and second output terminals, a switching equipment for connecting the first or fourth contact terminals to the first output terminal and for connecting the second or third contact terminals to the second output terminal, an applicator for applying a controlled variable between the first and second contact terminals or between the third and fourth contact terminals, and a control unit for controlling the switching equipment and the applicator for applying a controlled variable, the method for operating the sensor element including the steps of:

providing a first measurement value in a first measuring phase, wherein the control unit, for providing the first measurement value, applies a first controlled variable having a first polarity between the first and second contact terminals, connects the third contact terminal to the second output terminal, and connects the fourth contact terminal to the first output terminal; subsequently providing a second measurement value in a second measuring phase, wherein the control unit, for providing the second measurement value, applies a second controlled variable, having a polarity opposed to the first polarity, between the first and second contact terminals, connects the third contact terminal to the second output terminal, and connects the fourth contact terminal to the first output terminal; subsequently providing a third measurement value in a third measuring phase, wherein the control unit, for providing the third measurement value, applies the first controlled variable having the first polarity between the third and fourth contact terminals, connects the first contact terminal to the first output terminal, and connects the second contact terminal to the second output terminal; subsequently providing a fourth measurement value in a fourth measuring phase, wherein the control unit, for providing the fourth measurement value, applies the second controlled variable, having the polarity opposed to the first polarity, between the third and fourth contact terminals, connects the first contact terminal to the first output terminal, and connects the second contact terminal to the second output terminal; and determining a sensor signal on the basis of a difference between the first and second measurement values and a difference between the third and fourth measurement values.

The present invention is based on the findings that by means of a favorable segmentation of individual phases with the spinning-current principle, frequent switching between the contact terminals of the measuring element may be avoided. While with the spinning-current principle, a measuring current is applied, as a controlled variable, to the individual contact terminals of the measuring element, for example in a clockwise or in a counter-clockwise manner, the inventive approach envisages that the controlled variable, i.e. the control current, is initially fed to the measuring element in a first direction between two contact terminals, and that in a second measuring phase, the control current is fed to the measuring element in the opposite direction at the same contact terminals. This is followed by a "switching", i.e. by applying the control current to the measuring element at two further contact terminals, different from the first two contact terminals, in third and fourth measuring phases, it being possible again, in the third measuring phase, for the controlled variable to be applied to the measuring element in the first direction, and for the controlled variable to be applied to the measuring element, in the fourth measuring phase, in the direction which runs opposite to the direction of the controlled variable in the third measuring phase. Such a measuring approach enables a measuring variable to be measured at a measuring element without having to switch the contact terminals used as measuring contacts. Rather, by switching the direction of the controlled variable in the measuring element, the same effect may be achieved as if the measuring element is measured through in the clockwise or counter-clockwise direction (as in the prior art). To ensure that the measuring values detected are taken into account in a manner which is correct in terms of signs, the measuring signal then is to be determined on the basis of a difference between the first two measuring values and a difference between the third and fourth measuring values. The necessity of forming a difference results, in particular, from the fact that by reversing the controlled-variable direction in the measuring element while maintaining the measuring direction at the contact terminals used as measuring points, in a conventional spinning-current approach, the signs of the measuring values are reversed—as opposed to the prior art.

In contrast to the prior art, the inventive approach offers the advantage that by avoiding frequent switching of the contact terminals used as measuring contacts, a glitch energy may be reduced when a measuring signal is applied to the contact terminals. This results from the fact that switching the contact terminals leads, for example, to a reversal of the charge of parasitic capacitances of the measuring element, which is why, during reversal of the charge of the parasitic effects of the measuring element, energy pulses are formed which lead to measuring errors which, summed up, may make a considerable contribution to the offset of the measurement. In other words, this means that reversing the polarity of the controlled variable, as opposed to conventional switching, advantageously leads to no big common-mode signal jumps at the input of a chopper amplifier, since the voltage tappings remain at roughly the same potential when the supply terminals of the probe are switched. By maintaining constant the potential of the voltage tappings in this manner, a charge carrier injection, and thus charge-reversal energy, into the measuring element may be reduced, which results in a reduction of the offset in measuring with the measuring element, since the offset includes, among other things, averaging of the interference energy introduced during the measurement. By means of such a reversal of the polarity of the controlled variable (as opposed to re-clamping) at a constant switch position for tapping the measurement values, less energy therefore needs to be spent on recharging parasitic effects.

In addition, the offset may be further reduced, during a measurement, if after the four above-described measuring phases, four additional measuring phases follow one upon the other, wherein, for example, a fifth measuring phase corresponds to the second measuring phase, a sixth measuring phase corresponds to the first measuring phase, a seventh measuring phase corresponds to the third measuring phase, and an eight measuring phase corresponds to the fourth measuring phase. After these four additional measuring phases, four consecutive measuring phases could again be performed in a further measuring cycle, wherein, for example, a ninth measuring phase corresponds to the second measuring phase, a tenth measuring phase corresponds to the first measuring phase, an eleventh measuring phase corresponds to the third measuring phase, and a twelfth measuring phase corresponds to the fourth measuring phase. If the offset is be reduced once more, a thirteenth measuring phase may be configured, in an additional measuring cycle, which corresponds to the second measuring phase, a fourteenth measuring phase may follow which corresponds to the first measuring phase, a fifteen measuring phase may follow which corresponds to the fourth measuring phase, and a sixteen measuring phase may follow which corresponds to the third measuring phase. This switching corresponds to providing a combination of all possibilities offered when scrambling the first and second measuring phases, and when scrambling the third and fourth measuring phases in a measuring cycle. The order in which the first and second, and third and fourth measuring phases, respectively, are to be switched is not limited to the order described above. Rather, for example, the thirteenth to sixteenth measuring phases may be shifted back to the fifth to eighth or ninth to twelfth measuring phases, and the other measuring phases may be shifted back accordingly. Thus, the order mentioned above is only to be seen by way of example, it being necessary to note that the four measuring phases of a measuring cycle are all executed in succession, respectively. Such a switching of the individual measuring phases in the various measuring cycles offers further reduction of the offset, since, for example, when switching the current direction from a first flow direction to a flow direction offset by 90°, those transients which may decay when reversing the charge of the current direction, i.e. when switching the parasitic inductances or capacitances, must decay first of all. If, for example, measuring phase 3 is executed first, followed by measuring phase 4, measuring phase 3 will suffer more from these transients than measuring phase 4. If the order of measuring phase 4 and measuring phase 3 is switched later on, measuring phase 4 will suffer more from these transients than measuring phase 3. On average, they both will suffer equally from the transients, so that the mean offset should also be reduced as much as possible. In addition, it will then be necessary to also take into account the corresponding measurement values also for providing the sensor signal, which is to be performed, in particular, again by forming a difference of measurement values with opposite controlled variables.

BRIEF DESCRIPTION OF THE DRAWINGS

Preferred embodiments of the present invention will be explained below in more detail with reference to the accompanying figures, wherein.

DESCRIPTION OF PREFERRED EMBODIMENTS

Figure 1:
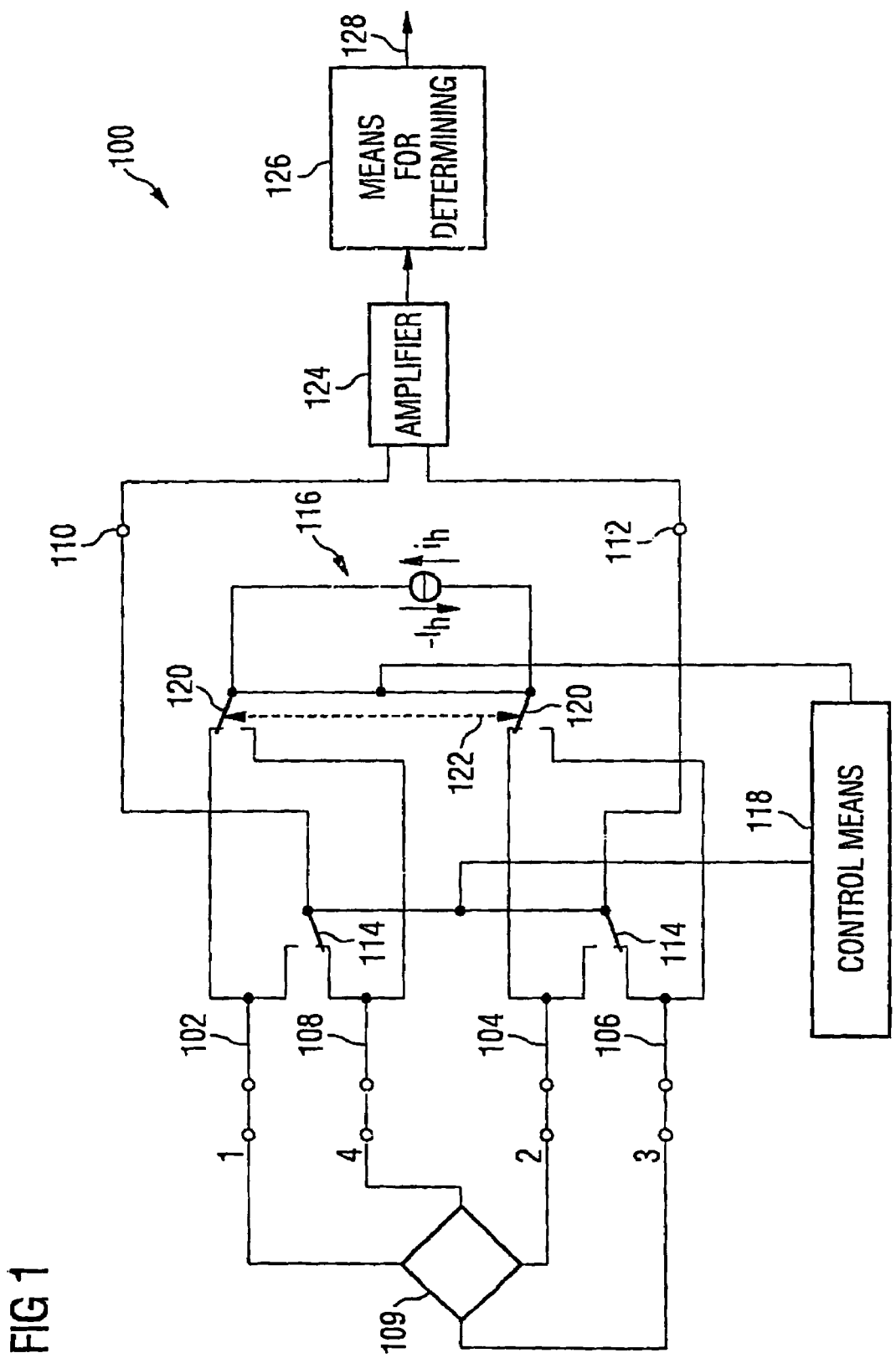
FIG. 1 is a block diagram of the inventive sensor element.

In the following description of the preferred embodiments of the present invention, identical or similar reference numerals will be used for those elements depicted in the various drawings which have similar actions, a repeated description of these elements being omitted.

FIG. 1 shows a block diagram of an embodiment of an inventive sensor element 100. The sensor element 100 includes a first contact terminal 102, a second contact terminal 104, a third contact terminal 106, and a fourth contact terminal 108. In addition, sensor element 100 includes a measuring element 109 which may be connected to the first contact terminal 102 via a first terminal, to the second contact terminal 104 via a second terminal, to the third contact terminal 106 via a third terminal, and to the fourth contact terminal 108 via a fourth terminal. In addition, the sensor element includes a first output terminal 110 and a second output terminal 112. Furthermore, the sensor element 100 has a switching means 114 for connecting the first contact terminal 102 or the fourth contact terminal 108 to the first output terminal 110 and for connecting the second contact terminal 104 or the third contact terminal 106 to the second output terminal 112. The sensor element 100 further comprises means 116 for applying a controlled variable between the first contact terminal 102 and the second contact terminal 104, or between the third contact terminal 106 and the fourth contact terminal 108. In addition, the sensor element 100 comprises control means 118 configured to switch the switching means 114 or means 116 for applying a controlled variable into different switching positions. In particular, control means 118 may control switching means 114 such that the switching means connects, in a first switching state, first contact terminal 102 to output terminal 110 as well as second contact terminal 104 to the second output terminal 112, or such that the switching means 114, in a second switching state, connects fourth contact terminal 108 to first output terminal 110, and third contact terminal 106 to second output terminal 112. In addition, control means 118 is configured to switch, in a first switching state, means 116 for applying a controlled variable such that the controlled variable (e.g. a control current) is applied between first contact terminal 102 and second contact terminal 104, or such that, in the second switching state, the controlled variable is applied between fourth contact terminal 108 and third contact terminal 106. This means that the switches 120 shown in FIG. 1 are always controlled synchronously, which is to be depicted by connection 122. In addition, means 116 for applying a controlled variable may be configured to apply, for example, a current flow $I_h$ in a first flow direction (i.e. $I_h$), and to apply a second flow direction (i.e. $-I_h$), opposed to the first flow direction, to two of contact terminals 102 to 108. This allows applying the controlled variables of the differing polarities to the measuring element 109. In addition, means 116 for applying a controlled variable, which is, for example, a current source, may be configured to use, for the controlled variable, a value, of a controlled variable, whose amount always remains the same. In addition, the sensor element 100 includes an amplifier 124 which may be configured, for example, in the form of a chopper amplifier. Amplifier 124 includes a first input connected to the first output terminal 110 of the sensor element 100, and further comprises a second output connected to the second output terminal 112 of the sensor element 100. In addition, amplifier 124 has an output connected to an input of a means 126 for determining the sensor signal, the means 126 for determining having an output for outputting the sensor signal 128.

Figure 2A:
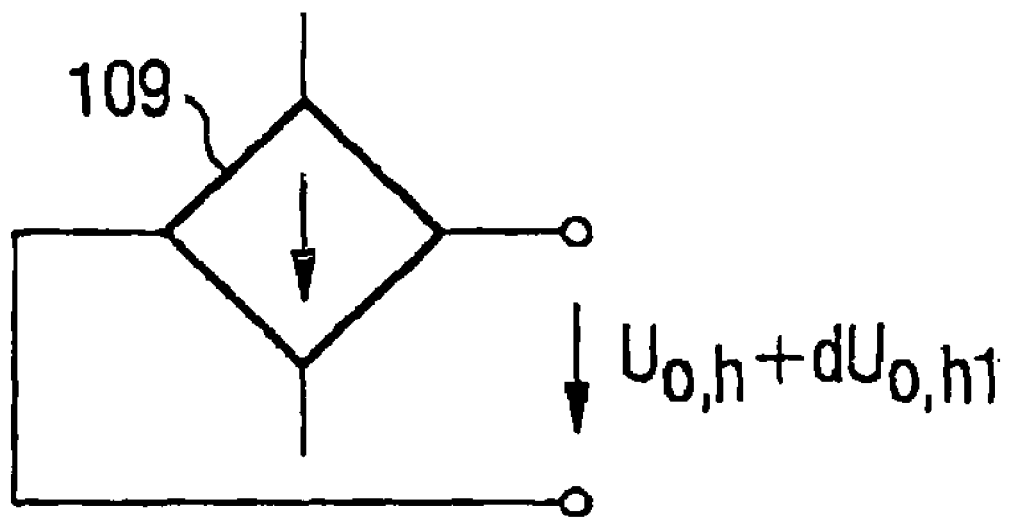
FIG. 2 is a diagrammatic representation of the sign-reversal when reversing the controlled variables in the inventive approach.
Figure 2B:
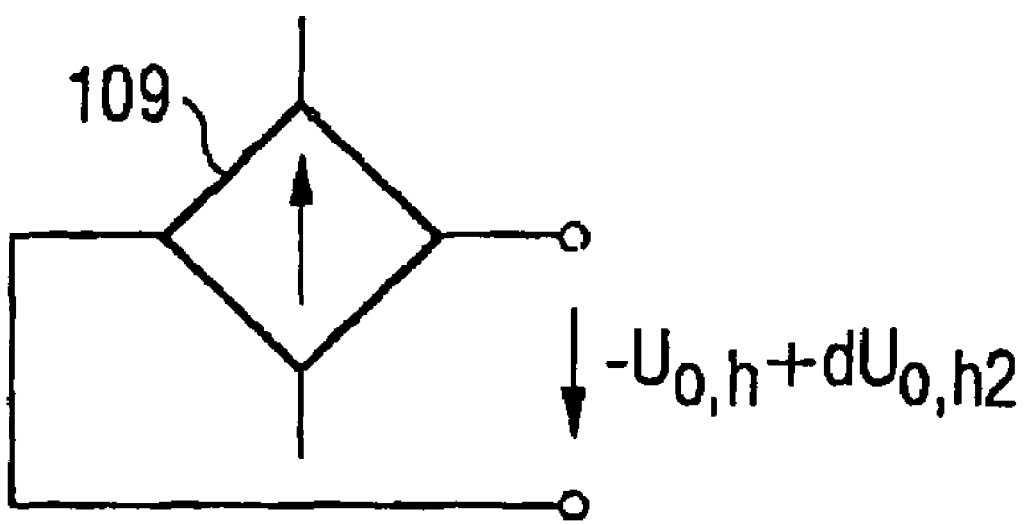
Figure 3A:
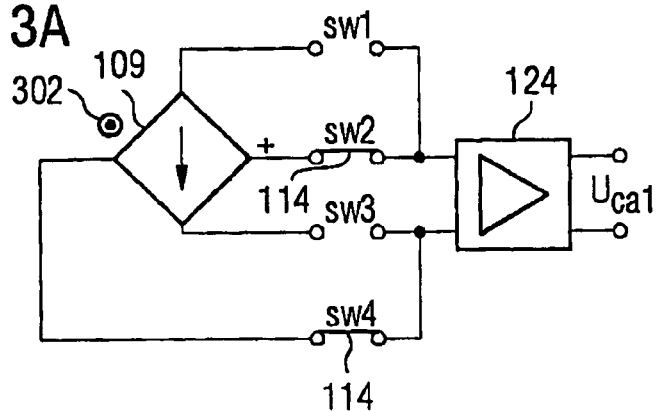
FIG. 3 is a representation of switched positions of the sensor element in the various measuring phases.
Figure 3B:
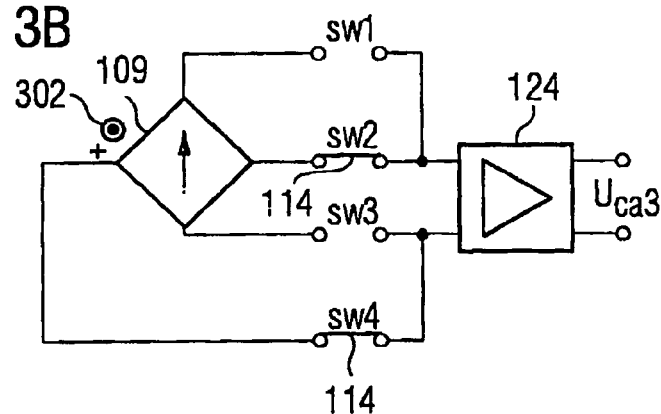
Figure 3C:
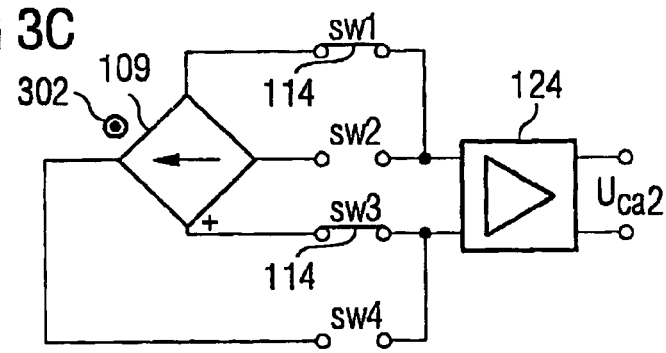
Figure 3D:
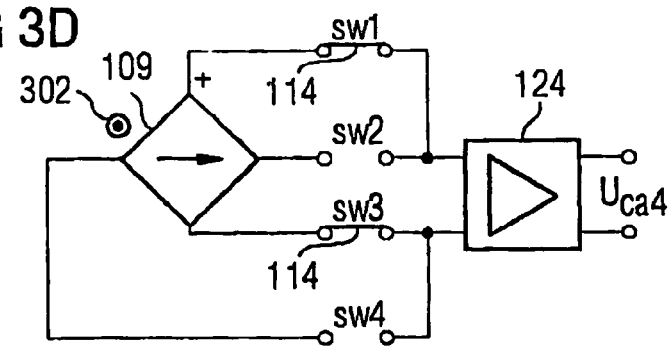

The functionality of the sensor element 100 depicted in FIG. 1 will be explained below in more detail with reference to the below FIGS. 2a and 2b as well as FIGS. 3a to 3d. In connection with a Hall sensor which may be, for example, the measuring element 109 in FIG. 1, a particularly apt clocking scheme may be used, so that the spinning-current principle and chopper technique are connected with one another, and such that the remaining offset of the chopper amplifier, and the remaining offset of the spinning-current Hall probe, which remaining offset stems from the non-linearity of the interior resistance of the Hall probe, are separable simultaneously from the wanted signal of the Hall probe in a simple manner.

In order to be able to distinguish more clearly between the repercussions of the individual effects, the subsequent notations shall be used in the further illustrations:

$S_i$ current-related magnetic sensitivity of the Hall probe $I_h$ supply current of the Hall probe B component, which is relevant for the Hall effect, of the magnetic induction applied G amplification factor of the chopper amplifier $U_{o,h}$ linear portion of the offset voltage of the Hall probe $dU_{o,h}$ non-linear portion of the offset voltage of the Hall probe $U_{o,pre}$ that portion of the offset voltage of the amplifier which is independent on the clock phase/switch position of the chopper amplifier $dU_{o,pre}$ that portion of the offset voltage of the amplifier which is independent on the clocking phase/switch position of the chopper amplifier.

In principle, the non-linear and linear portions of the offset voltage of the Hall probe may be clarified as follows. The Hall probe is said to exhibit an offset-generating asymmetry, since it is assumed, for example, that the resistance between two adjacent contacts is somewhat smaller than between all other adjacent contacts. This is depicted, for example, by a fat stroke in the upper right rhombus corner, wherein the rhombus is to be the measuring element 109 of FIG. 1, or the above-mentioned Hall probe. FIG. 2a shows how, in accordance with the assumption, a current flows vertically through the Hall probe from top to bottom. Since the upper right part has, as is assumed, a lower impedance than the rest, a positive offset $U_{o,h}>0$ will form. If current flows through the Hall probe 100 in the reverse direction, as is shown in FIG. 2b, this same asymmetry leads to a negative offset $-U_{o,h}<0$. This is exactly true for linear Hall probes.

However, in the practice of integrated circuits, Hall probes are non-linear since their active layer (typically of low n-type doping) lies in a p trough for electrical isolation from the rest of the integrated circuit (IC). The p trough then is at a potential which is lower than or, at the most, equal to the lowest potential in the n layer of the Hall probe, so that a space charge region SCR is formed at the p-n boundary. Said boundary has a thickness which is dependent on the cutoff voltage. However, at each supply voltage terminal of the probe, where the current is impressed into the probe, the cutoff voltage is at a maximum, and at an opposite terminal it is at a minimum. As a consequence, the SCR "nibbles" at, i.e. reduces, the thickness, available for current transport, of the active Hall area in the n trough. Since the layer has a variable thickness, the potential between negative and positive supply voltage terminals no longer runs linearly between the two, but takes a slightly curved course. In particular, the resistance between the positive supply voltage terminal of the probe and a tap of the Hall voltage is slightly larger than the resistance between this terminal and the negative supply voltage terminal, since the thickness of the Hall layer is reduced at the positive supply voltage terminal due to the higher pn cutoff voltage between the Hall layer and the p trough surrounding it. This non-linearity causes the depicted asymmetry to have a slightly larger effect in FIG. 2$a$ than in 2$b$, since in FIG. 2$a$, it is at a higher potential and is therefore more pronounced than in FIG. 2$b$. Thus, a total offset of $U_{o,h}+dU_{o,h1}$ results in FIG. 2$a$, whereas the total offset for the case depicted in FIG. 2$b$ is $-U_{o,h}-dU_{o,h2}$, wherein $d_{Uo,h1}>dU_{o,h2}>0$.

This connection is to be illustrated further by means of the following numerical example. The Hall probe is said, in accordance with the underlying assumption to have a resistance of 10 kΩ at a small potential (i.e. in a linear approximation) between two adjacent contacts. The asymmetry is said to amount to 10 Ω, i.e. at that point of the measuring element 109 which is drawn in bold print in FIG. 2$a$ or 2$b$, the resistance is said to be 9990 Ω. In addition, the non-linearity of the resistance is said to amount to 10%/V, i.e. if the resistance at zero volts is 10 kΩ, it is said to amount to 11 kΩ at one volt. When current is injected, an offset of $U_{oh}$=625 µV results, in the linear case, for a feed current of 250 µA, and in the non-linear case, as is depicted in FIG. 1$a$, this leads to a total offset of $U_{o,h}+dU_{o,h1}$=711.288 µV. Thus, a non-linear offset of $dU_{o,h1}$=86.132 µV results. As is depicted in FIG. 2$b$, the total offset is $-U_{o,h}-dU_{o,h2}$=−711.243 µV, so that the non-linear offset is $dU_{o,h2}$=86.087 µV. The difference between the non-linear offset fractions is 45 nV. The total offset then corresponds to about 3.5 mT, the non-linear offset is 420 µT, and the difference between the non-linear offsets is 0.22 µT.

To eliminate the offset and/or offset fractions of the switches at the chopper amplifier inputs as well as non-linear offset fractions of the Hall probe, the following clocking scheme, consisting of four clocking phases P1 to P4, may be used:

P1→P3: only the Hall current, i.e. the control current, is reversed; the switches at the chopper amplifier input remain unchanged;

P3→P2: the Hall current is reversed by +90°, and the switches at the chopper amplifier input are switched; and P2→P4: only the Hall current, i.e. the controlled variable, is reversed; the switch position at the chopper amplifier input remains unchanged.

Below, the four clock phases are depicted in a temporal sequence in FIG. 3$a$-3$d$. FIG. 3$a$ depicts the switch position and the flow direction of the Hall current during the first phase P1, FIG. 3$b$ depicts the switch position and the flow direction of the Hall current of the third phase P3, FIG. 3$c$ depicts the switch position and the flow direction of the Hall current in the second phase P2, and FIG. 3$d$ depicts the switch position and the flow direction of the Hall current in the fourth phase P4. Here it is to be noted that following clock phase P1, clock phase 3, as is depicted in FIG. 3$b$, is switched, followed by switching the second clock phase P2 shown in FIG. 3$c$, and followed by the fourth clock phase P4 depicted in FIG. 3$d$. In FIGS. 3$a$ to 3$d$, the current flow direction in the Hall probe is drawn as an arrow. The magnetic field is perpendicular to the drawing plane and projects out of the drawing plane, which is characterized by symbol 302.

In the first phase P1, depicted in FIG. 3$a$, the current in the diagram flows vertically through the Hall probe 109 from top to bottom. As a consequence, the electrons in the n-doped Hall probe gather at contact sw4, so that the field fraction of the Hall voltage having a positive sign is at the output of the chopper amplifier: $+E \cdot s_i \cdot I_h \cdot B$. The offset of the Hall probe, which is induced by the slightly low-impedance distance from sw1 to sw2, is also larger than zero, i.e. corresponds to the value of $+U_{o,h}$. Since the U(I) characteristic of the Hall probe (measured from sw1 to sw3) is not linear, the asymmetry between sw1 and sw3 causes a non-linear offset term plus $dU_{o,h1}$ larger than zero. By means of such a voltage measured, a voltage $U_{ca1}$ of $U_{ca1}=G \cdot (S_i \cdot I_h \cdot B+U_{o,h}+dU_{o,h1}+U_{o,pre}+dU_{o,pre24})$ may then be determined using amplifier 124.

If the direction of the current flowing through the Hall probe is reversed (as is shown in phase P3 depicted in FIG. 3$b$), the linear offset term is considered with a negative sign only, i.e. the linear offset term will then be $-U_{o,h}$. The non-linear offset term, on the other hand, changes not only its sign, but also its amount, i.e. becomes $-dU_{o,h3}$. In phase P1, the asymmetry is at a high potential, in phase P3 it is at a low potential. As a consequence, it leads to different amounts in the offset. In both clock phases, the offset of the pre-amplifier is identical, namely $U_{o,pre}$. Switches sw2 and sw4 also cause a dynamic offset error due to a mismatch. Since in both clock phases, the same switches remain closed, their offset errors are identical, and amount to $dU_{o,pre24}$. Using amplifier 124, this results in an output signal, at the amplifier output, of $U_{ca3}=G \cdot (-S_i \cdot U_h \cdot B-U_{o,h}-dU_{o,h3}+U_{o,pre}+dU_{o,pre24})$. After having a switch position and a current flow as is depicted in FIG. 3$b$, a current flow through the Hall probe 109 is reversed in the horizontal direction, as is depicted in FIGS. 3$c$ and 3$d$. These FIGS. 3$c$ and 3$d$ characterize phase P2 (FIG. 3$c$) and phase P4 (FIG. 3$d$). At the same time, when reversing the current direction, switches sw2 and sw4 are opened, and switches sw1 and sw3 are closed. Thereby, switches sw1 and sw3 now contribute to the offset with a new term $dU_{o,pre13}$. In phase P2, the asymmetry of the probes is at a high potential (as before in phase 1), so that the non-linear offset term $dU_{o,h1}$ appears. With a switch position and current flow direction as is depicted in FIG. 3$c$ for phase P2, a voltage of $U_{ca2}=G \cdot (-S_i \cdot I_h \cdot B+U_{o,h}+dU_{o,h1}+U_{o,pre}+dU_{o,pre13})$ results at the output of amplifier 124. In phase 4, the asymmetry of the probe is then at a low potential (as before in phase P3), so that the non-linear offset term $dU_{o,h3}$ contributes to the total offset. For phase P4, a voltage term of $U_{ca4}=G \cdot (S_i \cdot I_h \cdot B-U_{o,h}-dU_{o,h3}+U_{o,pre}+dU_{o,pre13})$ then results at the output of amplifier 124.

After determining the four output signals of amplifier 124 in the four clock phases P1 to P4, the signals are added in a sign-correct manner, whereby all offset portions may be reduced to near-zero/virtually eliminated. This sign-correct addition is performed in accordance with the following formula:

$$(U_{ca1}-U_{ca2}-U_{ca3}+U_{ca4})/4=S_i \cdot I_H \cdot B.$$

This addition may be performed either in a sample & hold circuit or in switched-capacitor circuits or in an integrator or in a digital arithmetic circuit. To this end, in particular, a switch at the output of the chopper amplifier may invert the differential output signal thereof in clock phases P2 and P3.

It is to be noted that it is essential for the present invention that the switches at the input of the chopper amplifier remain switched on for two successive clock phases and that the current direction in Hall probe 109 is reversed at the same time. If only signals in all four clock phases were to be added in a sign-correct manner, and if in the process, all four switches at the input of the chopper were to be actuated each time, the advantages of the present invention could not be benefited from by reducing a glitch energy. Such a switching of all switches at the input of the chopper amplifier 124 has already been put into practice, and one has found that the very injected glitch energy leads to an increase in the offset when the switches are switched. It is thus essential for the present invention that in two successive clock phases, such as clock phases P1 and P3, or in clock phases P2 and P4, respectively, the switches remain unchanged, but that only the polarity of the current flowing through the Hall probe is reversed. Thereby, the offset, which is caused by the unchanged switch position, may be separated from the Hall signal. This is shown by the differing signs in the expression $S_i \cdot I_h \cdot B$ which, however, shows the same signs for $dU_{o,pre24}$ and $dU_{o,pre13}$, respectively.

Even more symmetry results from the following order of the clock phases, FIG. 1 serving as an abbreviation of clock phase P1, FIG. 2 serving as an abbreviation for clock phase P2, FIG. 3 serving as an abbreviation for clock phase P3, and FIG. 4 serving as an abbreviation for clock phase P4:

1→3→2→4→1→3→4→2→3→1→2→4→3→1→4→2.

This order may also be composed differentially, for example in that the order may be subdivided into the four blocks 1→3→2→4, 1→3→4→2, 3→1→2→4 and 3→1→4→2, and in that each of the subblocks may be arranged in a different position toward one another. By means of such an expanded order, the offset may be further reduced, and because, when switching the current direction from, e.g., vertical to horizontal, the transients resulting from the switching first have to decay. If for example, phase 2 is executed first, and phase 4 is executed after that, phase 2 will suffer more from these transients than phase 4. If, later on, the order of phase 2 and phase 4 is switched, phase 4 will suffer more from these transients than phase 2. On average, they both suffer equally from these transients, so that the mean offset is also reduced as much as possible.

Reversing the current direction advantageously does not lead to any large common-mode signal jumps at the input of the chopper amplifier, since the voltage tappings remain at about equal potentials when the supply terminals of the probe are switched.

The essential principle of the invention shown therefore is similar to the nested chopper. The offset-generating glitch energy of the switches at the input of the chopper is eliminated since it vanishes, on a temporal average, by means of a well-chosen order with the spinning-current course, since identical terms are subtracted. Instead of a second, cascading chopper switch, the present invention thus uses only the reversal of polarity of the Hall-probe supply current. With the nested chopper, two switches are connected in series (at the input and at the output, the output being of less importance), these switches, which are nested, having different clock frequencies/switching frequencies. However, the disadvantage of such an arrangement is that each switch has a volume resistivity $R_{ds,on}$, and that, as a consequence, both $R_{ds,on}$ add up. This causes an increase in the noise as against one single switch. This noise may be reduced by making the switches larger and thus reducing their impedance, which, however, increases the charge carrier injection and thus also increases the remaining offset. This remaining offset may be reduced by chopping the slow switch to be even slower, but this reduces the bandwidth. In this manner it may be shown that the solutions of the prior art will always turn out to be problematic. By contrast, the inventive solution constitutes a remedy to this problem.

This principle may be expanded to further multiplying elements. In Hall probes, the wanted signal B is multiplied by supply current $I_h$. In XMR (CMR, GMR, MR . . . magnetoresistive) sensors, this also works, since here, too, the sign of the signal at the chopper input may be changed by reversing the polarity of the supply current of the sensor element.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A sensor element for providing a sensor signal, comprising:

a measuring element having first, second, third and fourth contact terminals;

a first output terminal and a second output terminal;

switching equipment for connecting the first or fourth contact terminals to the first output terminal, and for connecting the second or third contact terminals to the second output terminal;

a unit for applying a controlled variable between the first and second contact terminals or between the third and fourth contact terminals;

a control unit so as to, in a first measuring cycle, in a first measuring phase, apply a first controlled variable having a first polarity between the first and second contact terminals, connect the third contact terminal to the second output terminal, and connect the fourth contact terminal to the first output terminal so as to provide a first measurement value, subsequently in a second measuring phase, apply a second controlled variable, having a polarity opposed to the first polarity, between the first and second contact terminals, connect the third contact terminal to the second output terminal, and connect the fourth contact terminal to the first output terminal so as to provide a second measurement value; subsequently in a third measuring phase, apply the first controlled variable having the first polarity between the third and fourth contact terminals, connect the first contact terminal to the first output terminal, and connect the second contact terminal to the second output terminal so as to provide a third measurement value; subsequently in a fourth measuring phase, apply the second controlled variable, having the polarity opposed to the first polarity, between the third and fourth contact terminals, connect the first contact terminal to the first output terminal, and connect the second contact terminal to the second output terminal so as to provide a fourth measurement value; subsequently a determinator for determining the sensor signal, configured to provide the sensor signal on the basis of a difference between the first measurement value and the second measurement value, and a difference between the third measurement value and the fourth measurement value.

2. The sensor element as claimed in claim 1, which further comprises a chopper amplifier having first and second inputs, the first input of the chopper amplifier being connected to the first output terminal, and the second input of the chopper amplifier being connected to the second output terminal, and the chopper amplifier being configured to provide a first amplified measurement value from the first measurement value, a second amplified measurement value from the second measurement value, a third amplified measurement value from the third measurement value, and a fourth amplified measurement value from the fourth measurement value, and the determinator for determining the sensor signal being configured to take into account the first, second, third and fourth amplified measurement values.

3. The sensor element as claimed in claim 1, wherein the control unit is further configured to repeat the first measuring phase after the fourth measuring phase so as to provide a fifth measurement value, to subsequently repeat the second measuring phase so as to provide a sixth measurement value, to subsequently repeat the fourth measuring phase so as to provide a seventh measurement value, and to subsequently repeat the third measuring phase so as to provide an eight measurement value, the provider for providing the sensor signal being further configured to provide the sensor signal on the basis of a difference between the fifth and sixth measurement values and a difference between the seventh and eight measurement values.

4. The sensor element as claimed in claim 3, wherein the control unit is further configured to repeat the second measuring phase after the measuring cycle so as to provide a ninth measurement value, to subsequently repeat the first measuring phase so as to provide a tenth measuring value, to subsequently repeat the third measuring phase so as to provide an eleventh measuring value, and to subsequently repeat the fourth measuring phase so as to provide a twelfth measuring value, and wherein the provider for providing is further configured to provide the sensor signal also on the basis of a difference between the ninth and tenth measurement values and a difference between the eleventh and twelfth measurement values.

5. The sensor element as claimed in claim 4, wherein the control unit is further configured to repeat the second measuring phase after the measuring cycle so as to provide a thirteenth measurement value, to subsequently repeat the first measuring phase so as to provide a fourteenth measuring value, to subsequently repeat the fourth measuring phase so as to provide a fifteenth measuring value, and to subsequently repeat the third measuring phase so as to provide a sixteenth measurement value, the provider for providing being further configured to provide the sensor signal further on the basis of a difference between the thirteenth and fourteenth measurement values and a difference between the fifteenth and sixteenth measurement values.

6. The sensor element as claimed in claim 1, wherein the unit for applying a controlled variable includes a current source for providing a control current, the current source being provided to reverse a flow direction of the control current.

7. The sensor element as claimed in claim 1, which further comprises a measuring element and wherein the measuring element is a Hall probe.

8. The sensor element as claimed in claim 1, which further includes a measuring element and wherein the measuring element is a magnetoresistive sensor.

9. A method for operating a sensor element, the sensor element including a measuring element having first, second, third and fourth contact terminals, first and second output terminals, a switching equipment for connecting the first or fourth contact terminals to the first output terminal and for connecting the second or third contact terminals to the second output terminal, an applicator for applying a controlled variable between the first and second contact terminals or between the third and fourth contact terminals, and a control unit for controlling the switching equipment and the applicator for applying a controlled variable, the method for operating the sensor element comprising the steps of:

providing a first measurement value in a first measuring phase, wherein the control unit, for providing the first measurement value, applies a first controlled variable having a first polarity between the first and second contact terminals, connects the third contact terminal to the second output terminal, and connects the fourth contact terminal to the first output terminal; subsequently providing a second measurement value in a second measuring phase, wherein the control unit, for providing the second measurement value, applies a second controlled variable, having a polarity opposed to the first polarity, between the first and second contact terminals, connects the third contact terminal to the second output terminal, and connects the fourth contact terminal to the first output terminal; subsequently providing a third measurement value in a third measuring phase, wherein the control unit, for providing the third measurement value, applies the first controlled variable having the first polarity between the third and fourth contact terminals, connects the first contact terminal to the first output terminal, and connects the second contact terminal to the second output terminal; subsequently providing a fourth measurement value in a fourth measuring phase, wherein the control unit, for providing the fourth measurement value, applies the second controlled variable, having the polarity opposed to the first polarity, between the third and fourth contact terminals, connects the first contact terminal to the first output terminal, and connects the second contact terminal to the second output terminal; and determining a sensor signal on the basis of a difference between the first and second measurement values and a difference between the third and fourth measurement values.

10. A sensor element for providing a sensor signal, comprising:

a measuring element comprising two pairs of contact terminals;

a pair of output terminals;

a controllable switch for coupling either the first or second pair of contact terminals with the pair of output terminals;

a bias unit for applying a controlled variable between the first or second pair of contact terminals;

a control unit for controlling the controllable switch and the unit to couple one of said pairs of contact terminals with said pair of output terminals and the other pair of contact terminals with said bias unit.

11. The sensor element as claimed in claim 10, wherein said control unit
in a first measuring phase, applies a first controlled variable having a first polarity between the first pair of contact terminals, and couples the second pair of contact terminals with the pair of output terminals, subsequently
in a second measuring phase, applies a second controlled variable, having a polarity opposed to the first polarity, between the first pair of contact terminals, and couples the second pair of contact terminal with the pair of output terminals, subsequently
in a third measuring phase, apply the first controlled variable having the first polarity between the second pair of contact terminals, and couple the first pair of contact terminals with the pair of output terminals, and subsequently
in a fourth measuring phase, apply the second controlled variable, having the polarity opposed to the first polarity, between the second pair of contact terminals, and couple the first pair of contact terminals with the pair of output terminals.

12. The sensor element as claimed in claim 11, further comprising a determinator for determining the sensor signal, configured to provide the sensor signal on the basis of a difference between the first measurement value and the second measurement value, and a difference between the third measurement value and the fourth measurement value.

13. The sensor element as claimed in claim 12, which further comprises a chopper amplifier having a pair of inputs coupled with the first pair of output terminals, and the chopper amplifier being configured to provide a first amplified measurement value from the first measurement value, a second amplified measurement value from the second measurement value, a third amplified measurement value from the third measurement value, and a fourth amplified measurement value from the fourth measurement value, and the determinator for determining the sensor signal being configured to take into account the first, second, third and fourth amplified measurement values.

14. The sensor element as claimed in claim 12, wherein the control unit is further configured to repeat the first measuring phase after the fourth measuring phase so as to provide a fifth measurement value, to subsequently repeat the second measuring phase so as to provide a sixth measurement value, to subsequently repeat the fourth measuring phase so as to provide a seventh measurement value, and to subsequently repeat the third measuring phase so as to provide an eight measurement value, the provider for providing the sensor signal being further configured to provide the sensor signal on the basis of a difference between the fifth and sixth measurement values and a difference between the seventh and eight measurement values.

15. The sensor element as claimed in claim 14, wherein the control unit is further configured to repeat the second measuring phase after the measuring cycle so as to provide a ninth measurement value, to subsequently repeat the first measuring phase so as to provide a tenth measuring value, to subsequently repeat the third measuring phase so as to provide an eleventh measuring value, and to subsequently repeat the fourth measuring phase so as to provide a twelfth measuring value, and wherein the provider for providing is further configured to provide the sensor signal also on the basis of a difference between the ninth and tenth measurement values and a difference between the eleventh and twelfth measurement values.

16. The sensor element as claimed in claim 15, wherein the control unit is further configured to repeat the second measuring phase after the measuring cycle so as to provide a thirteenth measurement value, to subsequently repeat the first measuring phase so as to provide a fourteenth measuring value, to subsequently repeat the fourth measuring phase so as to provide a fifteenth measuring value, and to subsequently repeat the third measuring phase so as to provide a sixteenth measurement value, the provider for providing being further configured to provide the sensor signal further on the basis of a difference between the thirteenth and fourteenth measurement values and a difference between the fifteenth and sixteenth measurement values.

17. The sensor element as claimed in claim 12, wherein the unit for applying a controlled variable includes a current source for providing a control current, the current source being provided to reverse a flow direction of the control current.

18. The sensor element as claimed in claim 12, which further comprises a measuring element and wherein the measuring element is a Hall probe.

19. The sensor element as claimed in claim 12, which further includes a measuring element and wherein the measuring element is a magnetoresistive sensor.

20. A method for operating a sensor element to provide a sensor signal, the sensor element including a measuring element having two pairs of contact terminals, the method comprising the steps of:
providing a first measurement value in a first measuring phase by applying a first controlled variable having a first polarity between the first pair of contact terminals, and coupling the second pair of contact terminals with output terminals; subsequently
providing a second measurement value in a second measuring phase by applying a second controlled variable, having a polarity opposed to the first polarity, between the first pair of contact terminals, and coupling the second pair of contact terminal to the output terminals; subsequently
providing a third measurement value in a third measuring phase by applying the first controlled variable between the second pair of contact terminals, and coupling the first pair of contact terminals with the output terminals, subsequently
providing a fourth measurement value in a fourth measuring phase by applying the second controlled variable between the second pair of contact terminals, and coupling the first pair of contact terminals with the output terminals; and
determining a sensor signal on the basis of a difference between the first and second measurement values and a difference between the third and fourth measurement values.

21. The method as claimed in claim 20, further comprising the steps of repeating the first measuring phase after the fourth measuring phase so as to provide a fifth measurement value, subsequently repeating the second measuring phase so as to provide a sixth measurement value, subsequently repeating the fourth measuring phase so as to provide a seventh measurement value, and subsequently repeating the third measuring phase so as to provide an eight measurement value, and providing the sensor signal on the basis of a difference between the fifth and sixth measurement values and a difference between the seventh and eight measurement values.

22. The method as claimed in claim 21, further comprising the steps of repeating the second measuring phase after the measuring cycle so as to provide a ninth measurement value, subsequently repeating the first measuring phase so as to provide a tenth measuring value, subsequently repeating the third measuring phase so as to provide an eleventh measuring value, and subsequently repeating the fourth measuring phase so as to provide a twelfth measuring value, and providing the sensor signal also on the basis of a difference between the ninth and tenth measurement values and a difference between the eleventh and twelfth measurement values.

23. The method as claimed in claim 22, further comprising the steps of repeating the second measuring phase after the measuring cycle so as to provide a thirteenth measurement value, subsequently repeating the first measuring phase so as to provide a fourteenth measuring value, subsequently repeating the fourth measuring phase so as to provide a fifteenth measuring value, and subsequently repeating the third measuring phase so as to provide a sixteenth measurement value, and providing the sensor signal further on the basis of a difference between the thirteenth and fourteenth measurement values and a difference between the fifteenth and sixteenth measurement values.

* * * * *